United States Patent [19]

Tiers et al.

[11] Patent Number: 5,240,780

[45] Date of Patent: Aug. 31, 1993

[54] COLORED SALTS OF POLYMERIC SULFONATE POLYANIONS AND DYE CATIONS, AND LIGHT-ABSORBING COATINGS MADE THEREWITH

[75] Inventors: George V. D. Tiers, St. Paul; Percy C. Hughes, III, Maplewood, both of Minn.

[73] Assignee: Minnesota Mining and Manufacturing Company, St. Paul, Minn.

[21] Appl. No.: 771,514

[22] Filed: Oct. 2, 1991

Related U.S. Application Data

[63] Continuation of Ser. No. 449,157, Dec. 18, 1989, abandoned, which is a continuation of Ser. No. 152,985, Feb. 8, 1988, abandoned.

[51] Int. Cl.$^5$ .............................................. B32B 27/20
[52] U.S. Cl. .................................... 428/483; 8/654; 428/500; 428/343; 428/354
[58] Field of Search ............... 430/512, 159, 175, 176; 428/343, 483, 500; 8/654, 657

[56] References Cited

U.S. PATENT DOCUMENTS

| | | | |
|---|---|---|---|
| 2,532,011 | 11/1950 | Dahlquist et al. | 154/53.5 |
| 3,730,681 | 5/1973 | Trapasso et al. | 8/654 |
| 3,806,493 | 4/1974 | Wurmb et al. | 8/654 |
| 3,977,827 | 8/1976 | Kanishi et al. | 8/657 |
| 4,052,368 | 10/1977 | Larson | 260/75 S |
| 4,167,395 | 9/1979 | Englehardt et al. | 8/173 |
| 4,252,885 | 2/1981 | McGrall et al. | 430/160 |
| 4,299,743 | 11/1981 | Pierce et al. | 260/22 T |
| 4,304,851 | 12/1981 | McGrall et al. | 430/533 |
| 4,304,901 | 12/1981 | O'Neill et al. | 528/290 |
| 4,329,391 | 5/1982 | McAlister | 428/265 |
| 4,330,588 | 5/1982 | Larson et al. | 428/264 |
| 4,408,532 | 10/1983 | Incremora | 430/175 |
| 4,451,606 | 5/1984 | Campbell | 524/445 |
| 4,478,907 | 10/1984 | Van Gossum et al. | 428/327 |
| 4,480,085 | 10/1984 | Larson | 528/295 |
| 4,521,556 | 6/1985 | Adams | 524/88 |
| 4,529,661 | 7/1985 | Ninomiya et al. | 428/425.9 |
| 4,543,315 | 9/1985 | Lorenz et al. | 430/156 |
| 4,558,149 | 12/1985 | Larson | 560/14 |
| 4,612,343 | 9/1986 | Okuzono et al. | 524/547 |
| 4,636,438 | 1/1987 | Hudson et al. | 428/483 |
| 4,727,057 | 2/1988 | Harrison et al. | 428/483 |

FOREIGN PATENT DOCUMENTS

| | | |
|---|---|---|
| 0153736 | 4/1985 | European Pat. Off. |
| 0130789 | 9/1985 | European Pat. Off. |
| 0180402 | 7/1986 | European Pat. Off. |
| 3524197 | 1/1986 | Fed. Rep. of Germany |

OTHER PUBLICATIONS

The Condensed Chemical Dictionary 10th ed pp. 322–323.
Hackh's Chemical Dictionary; Fourth Edition; McGraw-Hill; pp. 227.

*Primary Examiner*—Jenna L. Davis
*Attorney, Agent, or Firm*—Gary L. Griswold; Walter N. Kirn; James V. Lilly

[57] ABSTRACT

Light-stable film-forming salts of a sulfonated polymer, especially a sulfonated polyester, and a cationic dye. When these dye-polysalts are coated onto shaped polymeric structures, especially transparent self-supporting films, the resultant products have important optical uses. A polyester film coated with certain red or amber blends of dye-polysalts and provided with a pressure-sensitive adhesive coating is useful as a lithographers' tape.

15 Claims, No Drawings

COLORED SALTS OF POLYMERIC SULFONATE POLYANIONS AND DYE CATIONS, AND LIGHT-ABSORBING COATINGS MADE THEREWITH

CROSS-REFERENCE TO RELATED APPLICATION

This is a continuation of Ser. No. 07/449,157 (filed Dec. 18, 1989, now abandoned, which was a continuation of Ser. No. 152,985 (filed Feb. 8, 1988) now abandoned.

BACKGROUND OF THE INVENTION

This invention relates to light-absorbing polymeric salts and to shaped polymeric structures, especially self-supporting films, coated therewith.

Photosensitive lithographic plates are readied for printing by exposing them to activating radiation through a negative, thereby rendering the exposed portions ink-receptive and the unexposed portions nonreceptive in the case of a negative-acting plate, or vice versa in the case of a positive-acting plate. The higher the quality of printing desired, the more important it is to avoid exposing undesired portions of the plate to radiation. Such inadvertent exposure may occur when pinholes or other flaws exist in the negative, or when certain portions of the negative must be blocked out for use in a different printing operation. It is usually necessary to achieve an absorbance of 3 to 3.5 to satisfy the lithographic preparator. An early attempt to solve this problem involved "painting," with a radiation-obscuring composition, the portions to be blocked out, a technique that is usually effective but tedious and irreversible.

A more sophisticated way to cover areas of a negative is to apply so-called lithographers' tape, a product in which a strongly dyed or pigmented unplasticized polyvinyl chloride (UPVC) resin composition is extruded as a 50-micrometer film and thereafter coated on one side with a normally tacky and pressure-sensitive adhesive (PSA). Although this commercially popular tape is convenient to apply, effective, and removable, it is not completely uniform in appearance, hence may raise doubts about quality and thus is less aesthetically appealing than may be desired. Further, the colorants required do not exhibit a "sharp cut-off" and hence severely limit the amount of visible but lithographically inactive (non-actinic) light transmitted; this light is used by the lithographic preparator to verify that desired information has not been inadvertently covered. Additionally, the acetone or other solvent often used to clean the lithographic negative tends to dissolve the UPVC and may cause the color to leach from the film, contaminating adjacent areas and causing considerable annoyance to the printer.

Attempts have been made to incorporate dye in such solvent-resistant polymers as polyethylene terephthalate and polypropylene, but processing at the required high levels of dye has proved difficult and the higher extrusion temperatures tend to decompose or volatilize the dye. Those dyes that are stable at high temperatures are very limited in the number of colors available. If the dye is incorporated in the pressure-sensitive adhesive, a residual "ghost" color image often remains on the negative when the tape is removed.

BRIEF DESCRIPTION OF THE INVENTION

In its broadest sense, the invention provides shaped polymeric substrates including films, fibers, fabrics, mats, coatings, particles, spheroids, or even randomly shaped masses with colored coatings or markings. In a presently preferred embodiment, the present invention provides an improved lithographers' tape, possessing the advantages of prior art tapes while avoiding their disadvantages. Like the previous tapes, the tape of the invention is easily applied to a negative, readily covering flaws, blemishes, or other areas to be masked; similarly, after use, it is easily removed. Unlike earlier tapes, however, the colored layer lies beneath the polymer film, so that it is resistant to solvent and its color does not leach. The appearance of this novel tape is uniform and aesthetically pleasing, it has good optical transparency in the non-actinic spectral region with a sharp cutoff, and since the color cannot migrate into the adhesive, it leaves no colored "ghost" after removal from a substrate.

The invention relies on a unique composition of matter that is a film-forming, essentially light-stable (i.e., remaining light-absorbing throughout the duration of its intended use and not undergoing polymerization) water-insoluble but organo-soluble salt of a polymeric sulfonate (especially a polyester sulfonate) anion and a dye cation. For convenience this salt will hereinafter be referred to as a "dye-polysalt". In one embodiment of the invention a layer of this dye-polysalt is bonded to a shaped polymeric substrate, especially a polymeric film, preferably one that is self-supporting. In another embodiment it is applied in imagewise fashion; e.g., the primary colors of cyan, magenta, and yellow, optionally including black, may be applied to produce polychromatic images, which may optionally be shaded. In the presently preferred embodiment of the invention, a layer of the dye-polysalt is bonded over an entire major surface of a self-supporting polymeric film, especially a polyester film, and overcoated with a normally tacky and pressure-sensitive adhesive, thereby yielding a lithographers' tape. For this purpose it is generally desirable for the dye-polysalt to absorb radiation having a wavelength of 250 to 1000 nm, especially 300 to 1000 nm.

DETAILED DESCRIPTION

For convenience, the polymeric sulfonates and cationic dyes employed in the examples are tabulated below:

Polymeric Sulfonates

Each of the following polymeric sulfonates is a sulfopolyester made by conventionally reacting the indicated molar amounts of diacids and diols to obtain a polymer having the sodium sulfonate equivalent weight listed.

| Sulfopolyester (Polymeric Sulfonate) | SO₃Na Equivalent Weight | Mole Percent | | | | | | | | |
|---|---|---|---|---|---|---|---|---|---|---|
| | | Diacid | | | | | | Diol | | |
| | | Sodium Sulfonated Isophthalic Acid | Ortho phthalic Acid | Isophthalic Acid | Terephthalic Acid | Adipic Acid | Sebacic Acid | Ethylene Glycol | 1,6-Hexane Diol | Polycaprolactone MW 530 |
| A | 2502 | 4.0 | 46 | | | | | 50 | | |
| B | 2962 | 5.0 | | | 45.0 | | | 40 | | 10 |
| C | 2490 | 5.0 | | 5.0 | 40.0 | | | 45 | | 5 |
| D | 1350 | 7.5 | | | 32.5 | 10 | | 50 | | |
| E | 1606 | 7.5 | | | 42.5 | | | 20 | 30 | |
| F | 1430 | 7.5 | | | 32.5 | | 10 | 50 | | |
| G | 1483 | 7.5 | | | 21.5 | | 21 | 50 | | |
| H | 1502 | 7.5 | | | 17.5 | | 25 | 50 | | |

The following polymeric sulfonate, hereinafter designated "J," was made by first reacting 2 moles of 5-sodiosulfonato-isophthalic acid and 1 mole of polycaprolactone diol (MW 530) to obtain a product having a molecular weight of 1,588. 50.0 grams of this product was then reacted with 26.5 grams of polycaprolactone diol (MW 530), 14.67 grams of ethylene glycol (MW 62.1), and an excess (55.33 grams) of toluene 2,4-diisocyanate (MW 174.1). The resultant sulfonated polyurethane polymer, which had a sulfonate equivalent weight of 4,653, was dissolved in tetrahydrofuran (THF) to obtain a 49% solids solution whose sulfonate equivalent weight was 9,530.

Another polymeric sulfonate sodium salt (designated "K" herein) was a "50% active" sulfonated polystyrene having a molecular weight of 40,000, obtained from Polysciences, Ltd. under the trade designation #8365. This salt is understood to have a sodium equivalent weight of 412.

Cationic Dyes

To the extent that the information is available, these dyes will be listed below by their Chemical Abstracts System (CAS) number, Colour Index number, their generic Colour Index name, and the dye name or trade name under which they were obtained. It is to be understood that as obtained from a commercial supplier the dyes may not be full strength and may contain additional substances to enhance their rate of solution. Certain dyes were separately prepared, using procedures well known to those skilled in the art; the Colour Index name or the structural formula for the dye cation is shown in each such case.

In cases where the dye concentration is inadequately known, the equivalent weight for the dye cation present may be estimated analytically in preparing the examples. For this purpose a gravimetric procedure based on precipitation of the dye as its tetraphenylborate or perfluoro(4-ethylcyclohexane) sulfonate salt is preferred. The filter containing the water-washed and dried precipitate (as well as the walls of the precipitation vessel, to which some dye-salt may adhere) is then extracted with the least polar reagent grade organic solvent capable of efficiently removing the dye-salt, which may be recovered by evaporation and weighed.

The equivalent weight of the dye sample is given by the ratio:

$$\frac{\text{Wt. of sample} \times \text{mol. wt. of dye-salt}}{\text{wt. of dye-salt}}$$

A volumetric procedure is often practical, based on the tendency of the aforementioned precipitants to generate a colloidal suspension of the dye-salt, which coagulates at or near the stoichiometric equivalence point due to reversal of the charge on the particles. Typically the clear solution will have lost nearly all its color at the true end-point. This procedure requires no knowledge of the molecular weight of the dye cation; the equivalent weight of the dye sample is given by the ratio:

$$\frac{\text{wt. of sample}}{\text{normality of titrant} \times \text{mL of titrant}}$$

In the absence of interfering substances, volumetrically-estimated equivalent weights normally fall within a few percent of those determined gravimetrically. In certain cases a useful, though usually less accurate, estimate of the equivalent weight of a dye sample is provided through followed by evaporation to dryness. This estimate is given by the ratio:

$$\frac{\text{wt. of sample} \times \text{mol. wt. of dye}}{\text{wt. of extracted dye}}$$

In each of these ratios weights are in milligrams.

The prime reason for dye analysis is to prevent having an excess of dye. It is not by any means essential to establish exact stoichiometric equivalence between dye cations and polysalt anions; an excess of the latter is not particularly harmful. If, however, the dye cations are in excess, they will be accompanied necessarily by non-polymeric anions, and will not be held by coulombic electrical forces to the polysalt, thus will be free to diffuse out and contaminate adjacent material. Such a situation departs from the spirit of this invention.

| Dye No. | CAS No. | Colour Index No. and Generic Name or Dye Cation Formula | | Dye Name or Trade Name | Dye Equivalent Weight |
|---|---|---|---|---|---|
| 1 | 6363-84-4 | 51215 | Basic Black 7 | — | 267 |
| 2 | 3521-06-0 | 42025 | Basic Blue 1 | New Solid Green 3B | 493 |
| 3 | 33203-82-6 | 51004 | Basic Blue 3 | Genacryl ® Blue 3G | 1160 |
| 4 | 61-73-4 | 52015 | Basic Blue 9 | Methylene Blue | 374 |
| 5 | 569-64-2 | 42000 | Basic Green 4 | Malachite Green | 473 |
| 6 | 3056-93-7 | 48035 | Basic Orange 21 | Atacryl ® Orange LGM-FS | 614 |
| 7 | 477-73-6 | 50240 | Basic Red 2 | Safranin Y | 351 |

-continued

| Dye No. | CAS No. | Colour Index No. and Generic Name or Dye Cation Formula | | Dye Name or Trade Name | Dye Equivalent Weight |
|---|---|---|---|---|---|
| 8 | 3648-36-0 | 48015 | Basic Red 13 | Atacryl ® Pink G-FS | 619 |
| 9 | 548-62-9 | 42555 | Basic Violet 3 | Crystal Violet | 493 |
| 10 | 81-88-9 | 45170 | Basic Violet 10 | Rhodamine B | 479 |
| 11 | 2390-54-7 | 49005 | Basic Yellow 1 | Thioflavin | 393 |
| 12 | 4208-80-4 | 48055 | Basic Yellow 11 | Atacryl ® Yellow 4G-FS | 449 |
| 13 | 12217-50-4 | | Basic Yellow 13 | Atacryl ® Yellow L5GA | 1300 |
| 14 | 12270-31-4 | | Basic Yellow 21 | Intradene ® Fast Yellow 7GL | |
| 15 | 52435-14-0 | 11480 | Basic Yellow 24 | Basacryl ® Yellow 5GL | 3220 |
| 16 | 41025-67-6 | 11450 | Basic Yellow 28 | Basacryl ® Yellow 5R | 738 |
| 17 | 54060-92-3 | 48054 | Basic Yellow 28 | Atacryl ® Yellow GA 200% | 807 |
| 18 | 12221-86-2 | | Basic Yellow 40 | Atacryl ® Brilliant Flavine 9GFF | |
| 19 | 61951-43-7 | | Basic Yellow 53 | Sevron ® Yellow 8GMF | |
| 20 | 71838-81-8 | | Basic Yellow 61 | Sandocryl ® Brilliant Yellow B5GL | |
| 21 | 71838-82-9 | | Basic Yellow 63 | Astrazon ® Yellow 8GSL | |
| 22 | 80802-82-0 | | Basic Yellow 73 | Cathilon ® Yellow CD-RLH | |

23

$$C_6H_5-\underset{\oplus}{N}(C_2H_5)=CH-CH=CH-N(C_2H_5)-C_6H_5$$

315

24  51802-84-7

$$\underset{C_6H_5}{\overset{C_6H_5}{>}}\underset{\oplus}{N}=CH-CH=CH-N\underset{C_6H_5}{\overset{C_6H_5}{<}}$$

411

25  21995-41-5

5,7-dimethyl-2,3-dihydro diazepinium $$CH_3-\underset{\oplus}{C}(\overset{HN-CH_2-CH_2-NH}{\underset{CH=}{|}})C-CH_3$$

160

26  40836-01-9

2,4,6-triphenyl-pyrylium(chloride)

345

27  46462-94-6

246

28  47827-22-5

714

29  80989-42-0

577

30  82926-12-3

860

-continued

| Dye No. | CAS No. | Colour Index No. and Generic Name or Dye Cation Formula | Dye Name or Trade Name | Dye Equivalent Weight |
| --- | --- | --- | --- | --- |
| 31 | * | $O_2N-C_6H_4-C(CH_3)_2-C(=N^+(C_2H_5)-)-CH=CH-C(Cl)=C(cyclohexenyl)-CH=CH-C(=N^+(C_2H_5)-)-C(CH_3)_2-C_6H_4-NO_2$ | | 983 |
| 32 | 47164-23-8 | $C_6H_5-N(CH_3)=CH-CH=CH-CH=CH-N^+(CH_3)-C_6H_5$ | | 313 |
| 33 | 22967-08-4 | morpholino$-N^+=CH-CH=CH-CH=CH-N-$morpholino | | 272 |
| 34 | | $O_2N-C_6H_4-NH-CH_2-CH_2-CH_2-N^+(CH_3)_3$ | 4-(3'-trimethyl-ammoniopropyl-amino) nitro-benzene | 365 |
| 35 | 78197-03-2 | 1,4-bis(HN-CH_2CH_2CH_2N^+(CH_3)_3)-anthraquinone | 1,4-bis(3'-tri-methylammonio-propylamino) anthraquinone | 346 |
| 36 | | $CH_3,CH_3-N^+(CH_2-CH_2)_2-N-C_6H_4-NO_2$ | 4-(4'-nitro-phenyl)-1,1-dimethylpiper-azinium | 363 |
| 37 | | Red dye mix of Example 1 | | 405 |

*U.S. Pat. App. 87-121571. Cpd. 5, Formula 2

EXAMPLE 1

A solution of 2.49 g. sulfopolyester C (sodium salt) in 20.00 g. methanol and 77.51 g. water was mixed with the ionic equivalent amount of the chloride salt of Dye No. 4, viz., 100 ml. of 0.01 N. aqueous solution. An immediate precipitation of the dye-polysalt occurred. The mixture was then heated to 80° C. on a steam bath for one hour to complete the reaction, little or no dye remaining in solution. The aqueous phase was removed by careful decantation and the solid deposit washed three times with 100-mL portions of 80° C. water for 15 min. to remove sodium chloride. The insoluble dye-polysalt, dried to constant weight in a 100° C. oven, weighed 2.7 g. A 1.0 g. portion was dissolved in 19.0 g. 1,2-dichloroethane to give an intensely blue solution, which upon application to poly(ethylene terephthalate) film dried to a strongly adherent water-resistant transparent blue coating. The coated film was usable as a filter for modifying the color of incandescent or fluorescent lights, as for decorative or photographic purposes.

The term "absorbance," as used herein, is defined in the manner accepted by spectroscopists, being the common logarithm of the ratio $I_o/I$, where $I_o$ is the intensity of the incident light and I the intensity of the transmitted light; normally this is defined for a relatively narrow wavelength interval and plotted as a function of wavelength. When the observed sample is a dye, there will typically be one or more wavelengths at which the absorbance passes through a maximum; such wavelengths are denoted by the symbol $\lambda MAX$. A measure of the breadth of the absorbing region is provided by defining the wavelengths $\lambda_A$ and $\lambda_B$, at which the sample absorbance is one-half of its value at $\lambda MAX$. We define $\lambda_A$ as the shorter of the two wavelengths, shorter also than $\lambda MAX$. The molar extinction coefficient, $\epsilon$, for a dye is defined as the absorbance of a dye (solution) sample, divided by the molar concentration of the dye and by the light's path length, in cm., in the sample. For the purposes of this invention it is convenient to define the relative extinction coefficient, $\epsilon_R$, as the ratio of a dye's $\epsilon$ to that for the dye methylene blue, (Dye No. 4), observed under similar conditions. It will be apparent that a dye should be selected to have a molar extinction coefficient suitable for the desired use; for the purposes of this invention $\epsilon_R$ must be greater than about 0.01, and preferably at least about 0.1, at one or more wavelengths. Those skilled in the art will also recognize that the absorbance of a coating is dependent on the concentration of the dye and the thickness of the coating, and that molar extinction coefficients of two or more dyes may be directly compared when they are present in the same coating and at known relative molar concentrations, provided that their absorptions do not overlap.

Methylene blue having been chosen as the standard and assigned a value of $\epsilon_R = 1.00$, it is only necessary to utilize other dyes such as Dyes No. 6 and 25 as secondary standards if, for example, a violet, blue, or green dye is to be compared. By this means it is not difficult to verify the utility of a dye for the purposes of this invention. It must not be assumed that dyes with the highest extinction coefficients will be suitable for all purposes; when less intense colors having high resistance to light-fading are required, dyes such as No. 34, 35, and 36 may be strongly preferred.

EXAMPLE 2

In a screw-capped 25-mL vial was placed 2.49 g. sulfopolyester C (sodium salt), 0.35 g. Dye No. 26, and 22.2 g. 1,2-dichloroethane. The mixture was heated to 70° C. (on a steam bath) until a low viscosity homogeneous solution of the dye-polysalt resulted, after which it was carefully decanted from the precipitated sodium chloride, and a portion was coated on polyester film. The transparent yellow coating, ($\lambda A = 338$ nm, $\lambda B = 438$ nm, $\lambda max = 415$ nm, $\epsilon R = 0.2$) also absorbed strongly in the near-ultraviolet, ($\lambda max = 366$ nm, $\epsilon R = 0.3$) and was suitable for use as an ultraviolet filter for removing the mercury emission lines (at ca. $\lambda = 365$ nm) that are typically strongly present, though unwanted, in fluorescent-light illumination. As an additional benefit, the strong emission lines at ca. $\lambda = 406$ nm are also removed.

EXAMPLE 3

Following the procedure of Example 3, a 0.71-g. portion of Dye No. 28 was reacted with an ionically equivalent amount of sulfopolyester D, (1.35 g.), and 1,2-dichloroethane (12.34 g.), to yield a deep blue solution which was separated by decantation from precipitated sodium salts and coated on polyester film. The strongly adherent and intensely blue coating had $\lambda max = 643$ nm. and also an even stronger absorption in the near-infrared region at $\lambda max = 827$ nm.

EXAMPLE 4

The procedure of Example 3 was repeated except that a 10% excess over the ionically equivalent amount of sulfopolyester A (2.75 g.) was used in place of sulfopolyester D, and 36.50 g. of 1,2-dichloroethane was used. The resulting deep blue solution, after filtration to remove fine particles down to about 8 micrometers, was applied to polyester film, forming a tightly-adherent water-resistant blue coating. When applied to a poly(-methyl methacrylate) optical-recording disk it absorbed the incident þreading" laser light of 820 nm.; however, when the solid state laser power was increased by a factor of about ten for the purpose of "writing" digital information, the heating effect of the strongly absorbed laser light was great enough to cause destruction of the dyed polymer layer and consequent removal of the dye, thus providing non-absorbing spots corresponding to the digital information being encoded, which then was immediately able to be "read" by the laser system operating in its lower power mode. Other dye-polysalts capable of absorbing infra-red radiation may, of course be substituted for the dye-polysalt used in this example.

EXAMPLE 5

Following the procedure of Example 2, seven vials, each containing 2.49 g. of sulfopolyester C and 22.2 g. of 1,2-dichloroethane, but differing in the amount of Dye No. 11, were prepared. The weights of dye varied in about equal steps from 0.39 to 0.19 g., thus providing ionic equivalent ratios, dye/sulfopolyester of 0.99, 0.91, 0.84, 0.75, 0.66 0.57 and 0.48. All went into solution, but with increasing difficulty and resulting in increasingly viscous solutions, varying from watery to a thick syrup. This behavior is in accord with there being a tendency toward ion-multiplet formation when unreplaced sodium cations are present but not when large dye cations predominate. The ion-multiplets bridge between different polymer chains, thus serving as labile crosslinks which cause increased viscosity. The extent of ion-multiplet formation decreases markedly at elevated temperatures. Coatings made from the lower ratio samples do, for example, show increasing tendency to swell and soften when contacted with moisture, a normally undesirable property; however, moderate departures from stoichiometry do not result in coatings having poor adhesion or other greatly inferior properties. Therefore it is not necessary to have an exact equivalent weight for the dye to be used in preparing a dye-polysalt.

EXAMPLE 6

In a one-gallon screw-capped glass jar were placed 429.0 g. of sulfopolyester F (0.300 molar equivalents of $Na^{\oplus}$) and an ionically equivalent amount of cations of a mixture of dyes, namely Dye No. 25, 6.42 g. (0.040 mole); Dye No. 23, 22.70 g. (0.072 mole); Dye No. 24, 24.66 g. (0.060 mole); Dye No. 12, 27.14 g. (0.061 mole); Dye No. 6, 9.60 g. (0.016 mole); and Dye No. 8, 30.16 g. (0.049 mole), and 3000 g. of 1,2-dichloroethane. The mixture was allowed to react under agitation and gentle warming to ca. 40° C. until all polymer had dissolved. The solution was then pressure-filtered to remove all particles larger than 2 micrometers. A small portion of this solution was evaporated to dryness to furnish material for solubility testing, and another small portion was used for adhesion testing. The remainder was employed in the following manner to provide deeply-colored non-actinic coating film and pressure-sensitive tape.

A thin coating of the dye-polysalt solution was applied by extrusion coating to one side of a 25-micrometer biaxially oriented polyethylene terephthalate (polyester) film, which was then passed through a 70° C. oven to evaporate the solvent, leaving a dried red coating approximately 8 micrometers thick. The coating thus produced absorbed light strongly from 310 nm to 565 nm with an absorbance of 3.5 or more within this range, yet showed good transparency from 600 nm to longer wavelengths, the absorbance being below 0.25. This is described as "sharp cut-off" behavior; the coating is essentially opaque to actinic light for common presensitized lithographic plates while not being optically opaque. A dilute urethane low adhesion backsize solution (cf. U.S. Pat. No. 2,532,011) was then applied to the opposite side of the film and the solvent evaporated. Next a dilute crosslinked acrylic primer solution was applied over the dye-polysalt coating and the solvent evaporated to leave a coating about 8 micrometers thick. Over the primer coating was then applied a 55% solids heptane solution of a 90:10 isooctyl acrylate:acrylic acid copolymer pressure-sensitive adhesive, and the solvent evaporated, leaving an adhesive coating about 25 micrometers thick, and providing a red-colored tape suitable for masking lithographic negatives. The fact that the thickness of the tape is less than the previously available commercial product is considered advantageous, as its lower profile is much less likely to cause handling difficulties.

EXAMPLE 7

Following the procedure of Example 6, 200.3 g. of sulfopolyester F (0.140 molar equivalent of Na⊕) was reacted with Dye No. 25, 4.82 g. (0.030 mole); Dye No. 23, 9.45 g. (0.030 mole); Dye No. 24, (12.33 g. (0.030 mole), Dye No. 12, 13.57 g. (0.030 mole); and Dye No. 6, 12.00 g. (0.020 mole) in 1500 g. of 1,2-dichloroethane. The filtered solution was similarly coated on the same grade of polyester film. The coating thus produced was essentially opaque to ultraviolet and visible light from 310 nm to 515 nm, exhibiting an absorbance in excess of 3.5 over that region. It showed good transparency from 540 nm to longer wavelengths, its absorbance being below 0.25. This film, and pressure-sensitive lithographic tape made therefrom by the method of Example 6, is non-actinic toward those presensitized lithographic plates that have been specially desensitized to wavelengths beyond about 500 nm in order that they may be handled under amber rather than red illumination. This is considered to be a substantial commercial advantage owing to the wider optical range which allows more precise use of the tape.

It is presently preferred to coat the dye-polysalts from an appropriate solvent, although it might be feasible to employ a colloidal dispersion, or even a hot melt for the more heat-resistant dyes. A solution can be applied by any suitable means, e.g., roll coating curtain coating, knife coating, painting, wiping, flow coating, spraying, and the like. Determination of an organic solvent that is useful for a given dye-polysalt is relatively easy, involving simple empirical experimentation.

For many uses, it is important that the dye-polysalt coating be well bonded to the support on which it is coated. As might be expected, the degree of adhesion of a given dye-polysalt is dependent on the specific substrate, and a dye-polysalt that adheres well to one substrate may not adhere nearly so well to another. On the other hand, a different dye-polysalt may have altogether different adhesion characteristics. The degree of adhesion can be measured conveniently by using a razor blade to score six parallel lines spaced about 1 mm apart in the dried coating and then to score an additional six similarly spaced parallel lines at right angles to the first, thereby creating a crosshatched pattern of 25 squares, each approximately 1 mm on a side. A strip of acrylic pressure-sensitive adhesive tape (3M "Magic" Tape, No. 810) is pressed firmly onto the crosshatched surface, the tape aligned at about 45° to the scored lines and allowed to dwell for approximately 30 seconds. The tape is then pulled away at approximately right angles to the surface, the degree of adhesion, expressed as percent, being four times the number of colored squares remaining adhered to the support. It has been found convenient to classify the degree of adhesion somewhat less precisely, as follows: "A", 100% adhesion; "B", 75–98%; and "C", less than 75%.

The following tabulated examples show the interrelationship of substrate and dye-polysalt on adhesion values:

| Example | Substrate | Dye-polysalt Dye Cation No. | Dye-polysalt Polymer Polyanion | Adhesion |
|---|---|---|---|---|
| 8 | Polystyrene sheet | 8 | Polyurethane sulfonate | C |
| 9 | Polystyrene sheet | 9 | Polystyrene sulfonate | A |
| 10 | Polystyrene sheet | Red polysalt mix of Example 6 | | C |
| 11 | Poly(methyl methacrylate) sheet | 8 | Polyurethane sulfonate | B |
| 12 | Poly(methyl methacrylate) sheet | 9 | Polystyrene sulfonate | A |
| 13 | Poly(methyl methacrylate) sheet | Red polysalt mix of Example 6 | | A |
| 14 | Polycarbonate | 8 | Polyurethane sulfonate | C |
| 15 | Polycarbonate | 9 | Polystyrene sulfonate | A |
| 16 | Polycarbonate | Red polysalt mix of Example 6 | | A |
| 17 | Styrenated Polyester | 8 | Polyurethane sulfonate | C |
| 18 | Styrenated Polyester | 9 | Polystyrene sulfonate | A |
| 19 | Styrenated Polyester | Red polysalt mix of Example 6 | | B |
| 20 | Polyimide film | 8 | Polyurethane sulfonate | B |
| 21 | Polyimide film | 9 | Polystyrene sulfonate | A |
| 22 | Polyimide film | Red polysalt mix of Example 6 | | A |
| 23 | Cellulose acetate film | 8 | Polyurethane sulfonate | C |
| 24 | Cellulose acetate film | 9 | Polyurethane sulfonate | A |
| 25 | Cellulose acetate film | Red polysalt mix of Example 6 | | C |
| 26 | Polyvinyl fluoride film | 8 | Polyurethane sulfonate | C |
| 27 | Polyvinyl fluoride film | 9 | Polyurethane sulfonate | B |
| 28 | Polyvinyl fluoride film | Red polysalt mix of Example 6 | | C |
| 29 | Polyvinyl chloride film | 8 | Polyurethane sulfonate | A |
| 30 | Polyvinyl chloride film | 9 | Polyurethane sulfonate | A |
| 31 | Polyvinyl chloride film | Red polysalt mix of Example 6 | | A |
| 32 | Polyvinylidene chloride film | 8 | Polyurethane sulfonate | A |
| 33 | Polyvinylidene chloride film | 9 | Polyurethane sulfonate | C |
| 34 | Polyvinylidene chloride film | Red polysalt mix of Example 6 | | A |
| 35 | Gelatin (photographic print) | 8 | Polyurethane sulfonate | C |
| 36 | Gelatin (photographic print) | 9 | Polystyrene sulfonate | A |
| 37 | Gelatin (photographic print) | Red polysalt mix of Example 6 | | A |
| 38 | Phenol formaldehyde | 8 | Polyurethane sulfonate | C |

| Example | Substrate | Dye-polysalt Dye Cation No. | Polymer Polyanion | Adhesion |
|---|---|---|---|---|
| | resin | | | |
| 39 | Phenol formaldehyde resin | 9 | Polystyrene sulfonate | B |
| 40 | Phenol formaldehyde resin | Red polysalt mix of Example 6 | | B |
| 41 | Melamine formaldehyde resin | 8 | Polyurethane sulfonate | C |
| 42 | Melamine formaldehyde resin | 9 | Polystyrene sulfonate | A |
| 43 | Melamine formaldehyde resin | Red polysalt mix of Example 6 | | C |
| 44 | Nylon sheet | 8 | Polyurethane sulfonate | C |
| 45 | Nylon sheet | 9 | Polystyrene sulfonate | B |
| 46 | Nylon sheet | Red polysalt mix of Example 6 | | B |
| 47 | Acetal sheet | 8 | Polyurethane sulfonate | B |
| 48 | Acetal sheet | 9 | Polystyrene sulfonate | A |
| 49 | Acetal sheet | Red polysalt mix of Example 6 | | B |
| 50 | Latex paint | 8 | Polyurethane sulfonate | B |
| 51 | Latex paint | 9 | Polystyrene sulfonate | A |
| 52 | Latex paint | Red polysalt mix of Example 6 | | A |
| 53 | Glossy oil paint | 8 | Polyurethane sulfonate | C |
| 54 | Glossy oil paint | 9 | Polystyrene sulfonate | B |
| 55 | Glossy oil paint | Red polysalt mix of Example 6 | | B |
| 56 | Polyester film | 8 | Polyurethane sulfonate | C |
| 57 | Polyester film | 9 | Polystyrene sulfonate | C |
| 58 | Polyester film | Red polysalt mix of Example 6 | | A |
| 59 | Polyurethane film | 8 | Polyurethane sulfonate | A |
| 60 | Polyurethane film | 9 | Polystyrene sulfonate | B |
| 61 | Polyurethane | Red polysalt mix of Example 6 | | A |

In the foregoing examples the polyurethane-sulfonate dye-polysalt was dissolved in, and coated from, a mixture of tetrahydrofuran and dichloromethane. Either of these solvents or 1,2-dichloroethane, could have been used individually for this purpose. They dye-polysalts typically show good solubility, in excess of 5% by weight, in a wide variety of useful coating solvents. Thus, the polystyrene-sulfonate dye-polysalt was coated from nitromethane but has good solubility in γ-butyrolactone, dimethyl sulfoxide, and 2,2,2-trifluoroethanol; it shows fair solubility (1% or greater) in cyclopetanone, pyridine, methanol, acetonitrile, dichloromethane, 1,2-dichloroethane, and 2-methoxyethanol. The polyester sulfonate dye-polysalt for the foregoing adhesion tests was coated from 1,2-dichloroethane, but equally good adherence was achieved when the dried dye-polysalt of Example 1 was dissolved in any of the following good solvents and coated on the polyester substrate: 2,2,2-trifluoroethanol, dichloromethane, cyclopentanone, tetrahydrofuran, nitromethane, γ-butyrolactone, warm glacial acetic acid, warm propylene carbonate, 1,4-dioxane, dimethyl sulfoxide, chloroform, or 1,1,2-trichloroethane. Fair solubility (1% or greater) is shown in acetone, acetonitrile, propylene dichloride, o-dichlorobenzene, 2-methoxyethyl acetate, and methyl or ethyl iodide.

In the following examples, dye-polysalts were formed by reacting the cationic dye indicated with sulfopolyester C, following the procedure of Example 2, and coating the resulting solutions on polyester film. Successful coatings were obtained in each case.

| Example | Dye No. | A | B | MAX | R |
|---|---|---|---|---|---|
| 62 | 2 | 593 | 677 | 645 | 1.2 |
| 63 | 3 | 594 | 677 | 658 | |
| 64 | 4 | 572 | 692 | 667 | [1.00] |
| 65 | 5 | 584 | 663 | 632 | 1.0 |
| 66 | 6 | 455 | 525 | 508 | 0.7 |
| 67 | 8 | 476 | 580 | 545 | 0.6 |
| 68 | 9 | 520 | 632 | 590 | 1.3 |
| 69 | 10 | 524 | 585 | 563 | 1.3 |
| 70 | 11 | 390 | 455 | 426 | 0.5 |
| 71 | 12 | 387 | 465 | 426 | 0.6 |
| 72 | 13 | 385 | 470 | 426 | |
| 73 | 14 | 394 | 461 | 424 | 0.9 |
| 74 | 18 | 408 | 465 | 440 | |
| 75 | 21 | 403 | 474 | 435 | |
| 76 | 22 | 397 | 494 | 452 | |
| 77 | 23 | 317 | 383 | 347 | 0.6 |
| 78 | 24 | 360 | 430 | 391 | 0.5 |
| 79 | 25 | <310 | 338 | 321 | 0.3 |
| 80 | 27 | <310 | 335 | 319 | 0.3 |
| 81 | 28 | | | 643 | 0.3 |
| | | | | 827 | 1.0 |
| 82 | 29 | 513 | 703 | 617 | |
| 83 | 30 | 786 | 852 | 805 | 3.6 |
| 84 | 31 | 748 | 864 | 820 | 1.8 |
| 85 | 32 | 424 | 498 | 456 | |
| 86 | 34 | 352 | 418 | 384 | 0.3 |
| 87 | 35 | | | 596 | 0.1 |
| | | | | 644 | 0.1 |
| 88 | 36 | | | 365 | 0.2 |
| 89 | 37 | <310 | 585 | | |
| The following dyes were used with sulfopolyester D: | | | | | |
| 90 | 4 | | | | |
| 91 | 6 | | | | |
| 92 | 8 | | | | |
| 93 | 11 | | | | |
| 94 | 12 | | | | |
| 95 | 28 | | | | |
| The following dyes were used with sulfopolyester A | | | | | |
| 96 | 6 | | | | |
| 97 | 7 | | | | |
| 98 | 8 | | | | |
| 99 | 12 | | | | |
| 100 | 15 | 378 | 477 | 430 | |
| 101 | 16 | 402 | 505 | 465 | |
| 102 | 17 | 410 | 505 | 455 | |
| 103 | 18 | 408 | 465 | 440 | |
| 104 | 20 | | | | |
| 105 | 28 | | | | |
| 106 | 33 | 395 | 445 | | |
| The following dyes were used with sulfopolyester B: | | | | | |
| 107 | 28 | | | | |
| 108 | 37 | <310 | 585 | | |
| The following dye was used with sulfopolyester E: | | | | | |
| 109 | 37 | <310 | 585 | | |
| The following dyes were used with sulfopolyester F: | | | | | |
| 110 | 1 | <310 | 700 | | |
| 111 | 6 | | | | |
| 112 | 8 | | | | |
| 113 | 12 | | | | |
| 114 | 23 | | | | |
| 115 | 24 | | | | |
| 116 | 25 | | | | |
| The following dye mixture was used with sulfopolyester G: | | | | | |
| 117 | 37 | <310 | 585 | | |
| The following dye mixture was used with sulfopolyester H: | | | | | |
| 118 | 37 | <310 | 585 | | |

EXAMPLE 119

Preparation of Dye No. 23. In a 750 mL Erlenmeyer flask fitted with an air condenser were placed 121.1 g (1.00 mole) of N-ethylaniline, 82.2 g. (0.50 mole) of 1,1,3,3-tetramethoxypropane, 51.0 g. (0.51 mole) of concentrated hydrochloric acid, and 100.0 g. of ethyl acetate. The reaction flask was heated on a steam bath for 18 hours, after which the volatile constituents were evaporated off, leaving 177 g. of red oil. To this oil was added 350 g. acetone, causing crystallization to occur after a short time, and the mixture was allowed to ripen for ca. 18 hours. The crystals were then filtered off and washed with about 1000 g. of acetone, until the filtrate was pale pink. There was recovered 100.34 g pinking crystals, m.p. 158°–160° (64% yield) of the chloride salt of Dye No. 23.

Examples 120 and 121 describe the preparation of a unique class of nitroaniline dyes bearing quaternary ammonium groups, suitable for preparing dye-polysalts for use in the practice of the invention.

EXAMPLE 120

Preparation of Dye No. 34. In a 125 mL flask were mixed 14.11 g. (0.10 mole) of 4-fluoronitrobenzene, 10.22 g. (0.10 mole) of 3-(dimethylamino) propylamine and 5.00 g. (0.12 mole) of dry sodium fluoride. Upon warming, a reaction began, and after an hour the mixture was heated to 150° C. for an hour. The mixture was cooled below 100° and treated with 400 mL water containing 0.10 mole sodium hydroxide at 60° C. for one hour; it was then chilled to solidify the freed amine and the aqueous phase was decanted off. After three water washings and drying, the crude product was dissolved in methyl tertiary butyl ether, filtered and evaporated to dryness, giving 19.69 g. (88% yield) of N-(3-dimethylaminopropyl) 4-nitroaniline, m.p. 60°–61.5° C. A 2.23 g. (0.01 mole) portion of this product was dissolved in 15 mL of acetone and treated with 2.13 g. (0.015 mole) of methyl iodide in a closed vessel. There was an immediate reaction and presently a yellow solid was suddenly precipitated. The mixture was warmed for ½ hour at 50° C. cooled, filtered, washed with acetone, and dried: the remaining solid, weighing 3.31 g., m.p. 210°–211.5° C., represented a 90% yield of Dye No. 34.

EXAMPLE 121

Preparation of Dye No. 36. In a 250 mL flask were mixed 28.22 g. (0.20 mole) of 4-fluoronitrobenzene, 20.04 g. (0.20 mole) of N-methylpiperazine, and 8.40 g. (0.20 mole) of dry sodium fluoride. There was a spontaneous reaction, the temperature rising to about 100° C.; the mixture was heated to 150° C. for one hour and then cooled and treated with 150 mL hot water containing 0.20 mole of sodium hydroxide to liberate the amine. A yellow precipitate formed, and most of the aqueous phase was decanted; 60 g. of hot chlorobenzene was added, and the solution was washed with three portions of hot water and allowed to crystallize upon cooling. The crude product, 40.54 g., m.p. 103°–105° C., was dissolved in 180 mL hot ethanol and treated with 3.00 g. active carbon; the mixture was filtered, washed with 50 mL hot ethanol, and on cooling deposited yellow crystals, 24.36 g., m.p. 105°–106° C. The filtrate was treated with 4.00 g. active carbon, filtered and boiled down to 60 mL; on cooling, an additional 15.00 g. of product, m.p. 105°–106° C., was recovered; the total yield of N-methyl-N'-(4-nitrophenyl) piperazine was 89%. A portion of this amine (2.21 g., or 0.01 mole), dissolved in 15 mL acetone, was treated with 2.84 g. (0.02 mole) methyl iodide in a closed vessel. An immediate reaction occurred; the mixture was then warmed to 60° C. for ½ hour and cooled. The precipitate was washed three times with acetone; when dried it weighed 3.55 g., the yield being 98%. It was dissolved in 70 mL hot water and on cooling crystallized to give 1.01 g., m.p. 257°–259°, of purified Dye No. 36. From the filtrate an additional 2.22 g. of dye was recovered.

Although numerous examples of the invention have been provided, it should not be presumed that the list of either dyes or sulfonated polymers is exhaustive. Among the many other useful dyes are the following: 15000-59-6, 11052, Basic Blue 54; 61901-59-5, 11056, Basic Orange 24; 12221-38-4, 11075, Basic Blue 66; 12221-37-3, 11076, Basic Blue 65; 14097-03-1, 11085, Basic Red 18; 12270-13-2, 11154, Basic Blue 41; 36904-42-4, 11175, Basic Orange 25; 12221-39-5, 11185, Basic Blue 67; 42373-03-6, 11460, Basic Red 29; 12221-63-5, 11465, Basic Red 39; 4443-99-6, 11825, Basic Black 2; 4569-88-4, 12210, Basic Blue 16; 26381-41-9, 12250, Basic Brown 16; 71134-97-9, 12251, Basic Brown 17; 68391-31-1, 12719, Basic Yellow 57; 39393-39-0, 45174, Basic Violet 11:1; 55798-23-7, 48100, Basic Yellow 23; 68123-13-7, 56059, Basic Blue 99; 633-03-4, 42040, Basic Green 1; 2185-87-7, 42563, Basic Blue 8; 2390-60-5, 42595, Basic Blue 7; 2185-86-6, 44040, Basic Blue 11; 4692-38-0, 44085, Basic Blue 15; 989-38-8, 45160, Basic Red 1; 2390-63-8, 45175, Basic Violet 11; 6359-45-1, 48013, Basic Violet 16; 6441-82-3, 48020, Basic Violet 7; 4657-00-5, 48040, Basic Orange 22; 4208-81-5, 48065, Basic Yellow 12; 6320-14-5, 48070, Basic Red 12; 4468-98-8, 50055, Basic Violet 6; 6411-47-8, 50250, Basic Red 10; 2381-85-3, 51182, Basic Blue 12; 4517-26-4, 51190, Basic Blue 10; 2679-01-8, 52020, Basic Green 5; 2391-29-9, 52025, Basic Blue 25; 12217-41-3, 61512, Basic Blue 22. (In the foregoing listing, the first number is the CAS number, and the second is the Colour Index number; the dye is further identified by its C.I. name.)

Among the many other usable sulfonated polymers are copolymers of sodium-4-sulfonatostyrene, sodium-(2-sulfonatoethyl)acrylate, sodium-(2-sulfonatoethyl) methacrylate, and especially polyesters of the same compositions as "A" through "H" above but in which the sodium-5-sulfonato isophthalic acid is partially or completely replaced by sodium-sulfonatosuccinic acid, sodium-sulfonatonaphthalene-2,6-dicarboxylic acid, or sodium sulfonatonaphthalene-1,8-dicarboxylic acid.

For practical reasons of synthesis, it is generally preferred that the cation equivalent weight of the polyesters should be at least about 1,000, whereas such is not the case with vinyl polymers. In all cases, a cation equivalent weight of about 5,000 represents a reasonable upper limit, beyond which the amount of dye that can be incorporated is extremely small.

It will likewise be appreciated that, while the sodium salts are presently preferred because of their relatively low cost and generally good solubility in water, lithium, potassium, or ammonium salts (or mixtures thereof) could also be used in preparing the dye-polysalts.

I claim:

1. An article comprising a substrate coated with a layer of at least one film-forming essentially light stable and water-insoluble but organic solvent soluble salt of a dye cation and a polymeric sulfonate polyanion having an anionic equivalent weight of about 400 to 5000 wherein said organic solvent is chlorinated and is substantially insoluble in water.

2. The article of claim 1 wherein the substrate is polymeric.

3. The article of claim 2 wherein the polymeric substrate is a film.

4. The article of claim 3 wherein the film is transparent.

5. The article of claim 4 wherein the transparent film is self-supporting.

6. The article of claim 5 wherein the film comprises biaxially oriented polyethylene terephthalate.

7. The article of claim 1 wherein the salt absorbs radiation having a wavelength in the range of from 250 to 1000 nm.

8. The article of claim 1 wherein the salt results from the use of essentially stoichiometric quantities of the polymeric sulfonate polyanion and the dye cation.

9. The article of claim 6 wherein the salt is overcoated with a layer of adhesive.

10. The article of claim 6 wherein the adhesive is a normally tacky and pressure-sensitive adhesive.

11. The article of claim 10 wherein the sulfonated polyester is the esterification product of at least one organic diol and at least two dicarboxylic acids, at least one said acids being monosulfonated and the total of sulfonated components being present in sufficient amount to yield, in the sodium salt form, a sulfonate equivalent weight from about 1,000 to about 5,000.

12. The article of claim 10 wherein more than one salt is employed, selected so as to yield a red color that blocks all actinic radiation.

13. The article of claim 12 wherein said actinic radiation is ultraviolet radiation.

14. The article of claim 10 wherein more than one salt is employed, selected so as to yield an amber color that blocks all actinic radiation.

15. The article of claim 14 wherein said actinic radiation is ultraviolet radiation.

* * * * *

UNITED STATES PATENT AND TRADEMARK OFFICE
CERTIFICATE OF CORRECTION

PATENT NO. : 5,240,780
DATED : August 31, 1993
INVENTOR(S) : George V. D. Tiers and Percy C. Hughes, III It is certified that error appears in the above-indentified patent and that said Letters Patent is hereby corrected as shown below:

Col. 4, line 43, after "through" insert --solvent extraction by dichloromethane, ethanol or the like,--.

Col. 5, Dye No. 16, "Basic Yellow 28" should read --Basic Yellow 25--.

Col. 9, line 52, "breading" should read --reading--.

Col. 12, Example 30, under the column entitled Polymer Polyanion, "Polyurethane sulfonate" should read --Polystyrene sulfonate--.

Col. 12, Example 33, under the column entitled Polymer Polyanion, "Polyurethane sulfonate" should read --Polystyrene sulfonate--.

Col. 15, line 15, "pinking" should read --pinkish--.

Signed and Sealed this

Twenty-ninth Day of November, 1994

BRUCE LEHMAN

Attest:

Attesting Officer    Commissioner of Patents and Trademarks